United States Patent
Korenivski

(10) Patent No.: US 7,679,155 B2
(45) Date of Patent: Mar. 16, 2010

(54) MULTIPLE MAGNETO-RESISTANCE DEVICES BASED ON DOPED MAGNESIUM OXIDE

(75) Inventor: Vladislav Korenivski, Vallentuna (SE)

(73) Assignee: VNK Innovation AB, Vallentuna (SE)

( * ) Notice: Subject to any disclaimer, the term of this patent is extended or adjusted under 35 U.S.C. 154(b) by 0 days.

(21) Appl. No.: 12/223,534

(22) PCT Filed: Feb. 8, 2007

(86) PCT No.: PCT/SE2007/050078

§ 371 (c)(1),
(2), (4) Date: Aug. 1, 2008

(87) PCT Pub. No.: WO2007/091971

PCT Pub. Date: Aug. 16, 2007

(65) Prior Publication Data

US 2009/0067232 A1    Mar. 12, 2009

(30) Foreign Application Priority Data

Feb. 10, 2006    (SE)    .................................. 0600305

(51) Int. Cl.
H01L 27/22 (2006.01)
H01L 43/00 (2006.01)
H01L 41/16 (2006.01)
(52) U.S. Cl. ............... 257/421; 257/425; 257/E43.001; 257/E27.006; 257/E29.323
(58) Field of Classification Search ............ 257/421, 257/425, E43.001, E27.006, E29.323
See application file for complete search history.

(56) References Cited

U.S. PATENT DOCUMENTS

| 4,959,696 | A | 9/1990 | Frensley et al. |
| 5,640,343 | A | 6/1997 | Gallagher et al. |
| 5,695,864 | A | 12/1997 | Slonczewski |
| 5,729,410 | A | 3/1998 | Fontana, Jr. et al. |
| 6,080,996 | A | 6/2000 | Yang |
| 6,229,153 | B1 | 5/2001 | Botez et al. |
| 6,347,049 | B1 | 2/2002 | Childress et al. |
| 6,756,128 | B2 | 6/2004 | Carey et al. |
| 2004/0130431 | A1 | 7/2004 | Matsukawa et al. |

(Continued)

OTHER PUBLICATIONS

Chshiev et al., "Magnetic diode effect in double-barrier tunnel junctions," Europhysics Letters, 2002, 58(2):257-263.

(Continued)

*Primary Examiner*—Evan Pert
(74) *Attorney, Agent, or Firm*—Foley & Lardner LLP

(57) ABSTRACT

The present invention provides a low resistance high magnetoresistance (MR) device comprised of a junction of two magnetic elements separated by a magnesium oxide (MgO) layer doped with such metals as Al and Li. Such device can be used as a sensor of magnetic field in magnetic recording or as a storage element in magnetic random access memory (MRAM). The invention provides a high-MR device possessing a diode function, comprised of a double junction of two outer magnetic elements separated by two MgO insulating layer and a center MgO layer doped with such metals as Al and Li. Such device provides design advantages when used as a storage element in MRAM. The invention with MR wherein a gate electrode is placed in electrical or physical contact to the center layer of the double tunnel junction.

22 Claims, 4 Drawing Sheets

U.S. PATENT DOCUMENTS

2005/0009211 A1    1/2005    Linn et al.

OTHER PUBLICATIONS

Fuchs et al., "Spin-transfer effects in nanoscale magnetic tunnel junctions," Applied Physics Letters, Aug. 16, 2004, 85(7):1205-1207.

Kärner et al., "Anion interstitials in neutron-irradiated MgO single crystals," Radiation Measurements, 2001, 33:625-628.

Moodera et al., "A new design for reprogrammable microprocessors based on single nnagnetoresistie elements has the potential to thrust magnetoelectronics from journal concept to everyday product," Nature Materials, Novembre 2003, 2:707-708.

Parkin et al., "Giant tunnelling magnetoresistance at room temperature with MgO (100) tunnel barriers," Nature Materials, Dec. 2004, 3:862-867.

Pedrosa et al., "Analytical electron microscopic studies and positron lifetime measurements in Al-doped MgO crystals," J. Appl. Phys., Jul. 15, 1987, 62(2):429-433.

Pinto et al., "Magnetic nanoscale aggregates of cobalt and nickel in MgO single crystals," Eur. Phys. J. B, 2005, 45:331-338.

Savoini et al., "Copper nanocolloids in MgO crystals implanted with Cu ions," Nuclear Instruments and Methods in Physics Research B, 2004, 218:148-152.

Slonczewski, J.C., "Current-drive excitation of magnetic multilayers," Journal of Magnetism and Magnetic Materials, 1996, 159:L1-L7.

Slonczewski, J.C., "Excitation of spin waves by an electric current," Journal of Magnetism and Magnetic Materials, 1999, 195:L261-L268.

Tardio et al., "$p$-type semiconducting properties in lithium-doped MgO single crystals," Physical Review B, 2002, 66:134202-1 to 134202-8.

Tardio et al., "Electrical conductivity of as-grown and oxidized MgO:Li crystals implanted with Li ions," Nuclear Instruments and Methods in Physics Research B, 2004, 218:164-169.

Yuasa et al., "Giant room-temperature magnetoresistance in single-crystal Fe/MgO/Fe magnetic tunnel junctions," Nature Materials, Dec. 2004, 3:868-871.

MULTIPLE MAGNETO-RESISTANCE DEVICES BASED ON DOPED MAGNESIUM OXIDE

CROSS-REFERENCE TO RELATED APPLICATIONS

This application is a National Stage application of PCT/SE2007/050078, filed Feb. 8, 2007, which claims priority from Swedish application SE 0600305-7, filed Feb. 10, 2006.

FIELD OF THE INVENTION

The present invention relates to magnetic field sensors, memory elements, and three-terminal logic devices for recording head, external field sensing, MRAM and logic applications. In particular the invention provides improved magnetic junction devices based on doped MgO layers.

BACKGROUND OF THE INVENTION

A device comprised of two ferromagnetic layers separated by an insulating tunnel barrier is known as a magnetic tunnel junction (MTJ). The cross-section of a conventional MTJ is illustrated in FIG. 1. It consists of bottom terminal 18 placed on a substrate or an underlayer, followed by the first magnetic layer 14, the oxide tunnel barrier 10, the second magnetic layer 12, and the top terminal 16. The resistance of such MTJ is a function of the relative orientation of the magnetizations of the two magnetic layers, being lowest for parallel (P) alignment and highest for anti-parallel (AP) alignment. One of the magnetic layers is made magnetically hard and the other magnetic layer is made magnetically soft such that the two layers switch in different magnetic fields. This can be achieved either by choosing magnetic materials of different magnetic anisotropy or by exchange biasing one of the layers using an antiferromagnetic layer. The P and AP states are realized by applying an external magnetic field sufficient to switch the soft layer but not the hard layer. The associated change in resistance can be used to sense magnetic field in such device as a read head of a hard drive in magnetic recording as described in [1]. Such high-MR MTJ's can also be used as storage elements in MRAM as described in [6]. Here the different resistance values for P and AP states of the junction correspond to stored values of the magnetic bit, "0" and "1".

It is essential for sensor applications that the signal to noise ratio (SNR) of the device is large. The signal for a magnetic junction sensor is the voltage given by the change in resistance caused by an applied magnetic field ($\Delta R$–deltaR) times the biasing current flowing through the junction ($I_B$), $V_S = I_B \Delta R$. The predominant noise mechanism of the magnetic junction is its thermal noise, which is proportional to the square root of the device resistance, $R^{0.5}$. In an MTJ the device resistance is dominated by the resistance of the tunnel barrier, such as Al—O, with the leads and the ferromagnetic layers making a vanishingly small contribution. It is therefore highly desirable to decrease the resistance of the barrier (R) without reducing $\Delta R$. R increases as the junction is made smaller in inverse proportion to the junction area (A), the product RA remaining essentially constant. Therefore, for smaller junctions of the future generations of field sensors the demand for reducing the resistance of the barrier is even higher. The desired values for the resistance-area product are RA<1000 Ohm-um$^2$, preferably RA<10 Ohm-um$^2$ as described in [2]. Similar noise and scaling considerations apply to MTJ's used in MRAM [6]. Additionally, low resistance barriers are required for MRAM cells utilizing the effect of current induced magnetization switching, described in [3,4] and experimentally observed in [5]. Relatively high currents (typically a few mA) flowing through an MTJ are needed for producing switching of the soft magnetic layer. In order not to exceed the breakdown voltage of the MTJ (approximately 1 V) the resistance of the junction should preferably be smaller than 1 kOhm. This corresponds to preferably RA<10 Ohm-um$^2$ for a junction of ~0.01 um$^2$ in area.

The resistance of a tunnel barrier is an exponential function of the barrier thickness, with thinner barriers having lower resistance. For very thin barriers of thickness less then 1 nm, however, the useful signal ($\Delta R$) decreases due to microscopic pinholes and other defects in the barrier as described in [2]. It is therefore desirable for sensor and MRAM applications to have an independent means of reducing the resistance of the barrier while preserving the barrier thickness, necessary for achieving high MR.

Another desirable characteristic of a magnetic junction is current rectification. This property is conventionally realized in semiconductor diodes and is manifest in different currents through the device for a given bias voltage of positive and negative polarity. The ratio of these two current values is known as the rectification ratio (RR). Incorporating a diode in series with an MTJ in an MRAM cell can provide a significantly improved memory density as described in [6]. The diode blocks current for one bias polarity through MTJ's placed at cross-points of a 2D array of word and bit lines and allows current for the other bias polarity, thus providing a cell select mechanism built into the MTJ stack. However, fabricating efficient semiconductor diodes within metal-oxide MTJ stacks is a highly non-trivial task. It is highly desirable that the diode function is implemented within the same metal-oxide material system. Double tunnel junctions of the general structure magnet1/oxide/metal/oxide/magnet2 with atomically thin metal center electrodes and asymmetric oxide tunnel barriers can exhibit current rectification as described in [7]. Such diode structure is a variation of a conventional semiconductor Resonant Tunneling Diode described in detail in e.g. [8]. The spin sensitivity of the outer electrodes (magnet1 and magnet2) combined with transport through discrete energy states in the center electrode can provide high-MR and diode functionality—an ideal combination for use in MRAM applications. The thickness of the center metal layer must be comparable to its Fermi wavelength, which is smaller than 1 nm in most metals. For such thin metal layers dimensional quantization in the direction of current (perpendicular to the layers) results in transport through discrete electron states in the layer. Roughness of even one monolayer can significantly affect the performance of the device. The need for atomically thin and atomically smooth metal layers imposes practical limitations on the use of such a double barrier device where the center electrode is a metal.

The electronic energy states of the center electrode in the double-junction described above can be affected electrically by an additional electrode placed in physical or electrical contact to the center electrode—a gate. Such a spin-dependent three-terminal device is a variation of a conventional Resonant Tunneling Transistor described in detail in e.g. [9]. The combination of MR and gate control can provides the basis for novel logic applications, in particular in reprogrammable logic [10].

Use of MgO yields MR ($\Delta R/R$) of 100%-1000% in magnet1/MgO/magnet2 type junctions as described in [11]. The commonly used materials for the magnet layers are Fe, Co, Fe—Co, Fe—Ni, Fe—Co—B alloys. Magnetic junctions based on MgO are preferred in applications based on MR compared to junctions based on, for example, Al and Ti oxides where the typical MR value is ~30%. Therefore, it is highly desirable for sensor, memory, and logic applications described above to improve the MgO barrier in such a way as to lower its resistance for a given thickness.

Thus, it is in the art demonstrated the envisaged potentials of devices utilizing tunneling effects, comprising dual magnetic layers. However, the performance of such devices is presently often impaired by defects relating to the problems of providing thin enough layers separating the magnetic layers.

SUMMARY OF THE INVENTION

Obviously an improved method and device, that makes it possible to fully take advantage of the possibilities of magnetic tunneling devices, are needed.

The object of the present invention is to provide a device and method of producing such that overcome the drawbacks of the prior art techniques. This is achieved by the device and the method of the present invention.

The present invention provides a low-resistance high-MR junction of two magnetic layers separated by a doped MgO layer. The magnets can be such known ferromagnetic metals as Fe, Co, Ni, Fe—Co, Ni—Fe, Fe—Co—B, other ferromagnetic or ferrimagnetic metal alloys or semiconductors. The MgO layer is doped with such elements as Al or Li to lower the resistance of the material. Such $Mg_xM_yO$ layers (M=Al, Li, ...) are formed by depositing a film of Mg—Al or Mg—Li with a subsequent exposure to an oxygen atmosphere. Alternatively, the $Mg_xM_yO$ layer can be formed by reactively sputtering the Mg—Al or Mg—Li alloy in a mixture of Ar—$O_2$. The MTJ is formed by sequential deposition of magnetic layer 1, $Mg_xM_yO$ layer, and magnetic layer 2.

The present invention provides a magnetic double junction device having an asymmetric current-voltage characteristic (diode function). Such a device is formed by two magnetic layers such as Fe, Co, Ni, alloys Fe—Co, Ni—Fe, Fe—Co—B, or other ferromagnetic alloys or semiconductors. The two magnetic layers are separated by generally a tri-layer of MgO/$Mg_xM_yO$/MgO, where the thicknesses of the individual layers are adjusted to optimize the MR and the diode characteristic of the device. MgO/$Mg_xM_yO$/MgO tri-layer can be formed by a sequential sputtering of the Mg, $Mg_xM_y$ (M=Al, Li, ...), and Mg layers in a mixture of Ar—$O_2$. The double-MTJ is formed by sequential deposition of magnetic layer 1, MgO layer 1, $Mg_xM_yO$ layer, MgO layer 2, and magnetic layer 2.

The present invention provides a three terminal magnetic junction. Such a device is formed by two magnetic layers such as Fe, Co, Ni, alloys Fe—Co, Ni—Fe, Fe—Co—B, or other magnetic alloys or semiconductors. The two magnetic layers are separated by generally a tri-layer of Mg/$Mg_xM_yO$/MgO, where the thicknesses of the individual layers are adjusted to optimize the MR and the trans-resistance of the device. An additional gate electrode is placed in physical or electrostatic contacts with the center $Mg_xM_yO$ layer to affect its electronic configuration. In addition to MR the conduction through the device is sensitive to the potential on the gate electrode, making it a spin dependent trans-resistor. MgO/$Mg_xM_yO$/MgO tri-layer can be formed by sequential sputtering the Mg, $Mg_xM_y$ (M=Al, Li, ...), and Mg layers in a mixture of Ar—$O_2$. The double-MTJ is formed by sequential deposition of magnetic layer 1, MgO layer 1, $Mg_xM_yO$ layer, MgO layer 2, and magnetic layer 2. One implementation is to suitably pattern magnetic layer 2 to allow a contact to the top MgO layer of a metallic gate electrode.

It will be understood by those skilled in the art that the said method of formation of the doped MgO layer by sputtering off an Mg target in Ar—$O_2$ mixture is one example. Other methods include, but are not limited to, sputtering of a composite $Mg_xM_yO$ oxide target in Ar, sputtering off an MgO target in Ar—$N_2$ mixture, or sputtering off an Mg target in Ar—$O_2$—$N_2$ mixture. In these cases M=Li, Al, N, ... act as dopant atoms in MgO, with metal atoms preferentially substituting Mg and N atoms preferentially substituting O.

Embodiments of the invention are defined in the dependent claims. Other objects, advantages and novel features of the invention will become apparent from the following detailed description of the invention when considered in conjunction with the accompanying drawings and claims.

DETAILED DESCRIPTION

Figure 1:
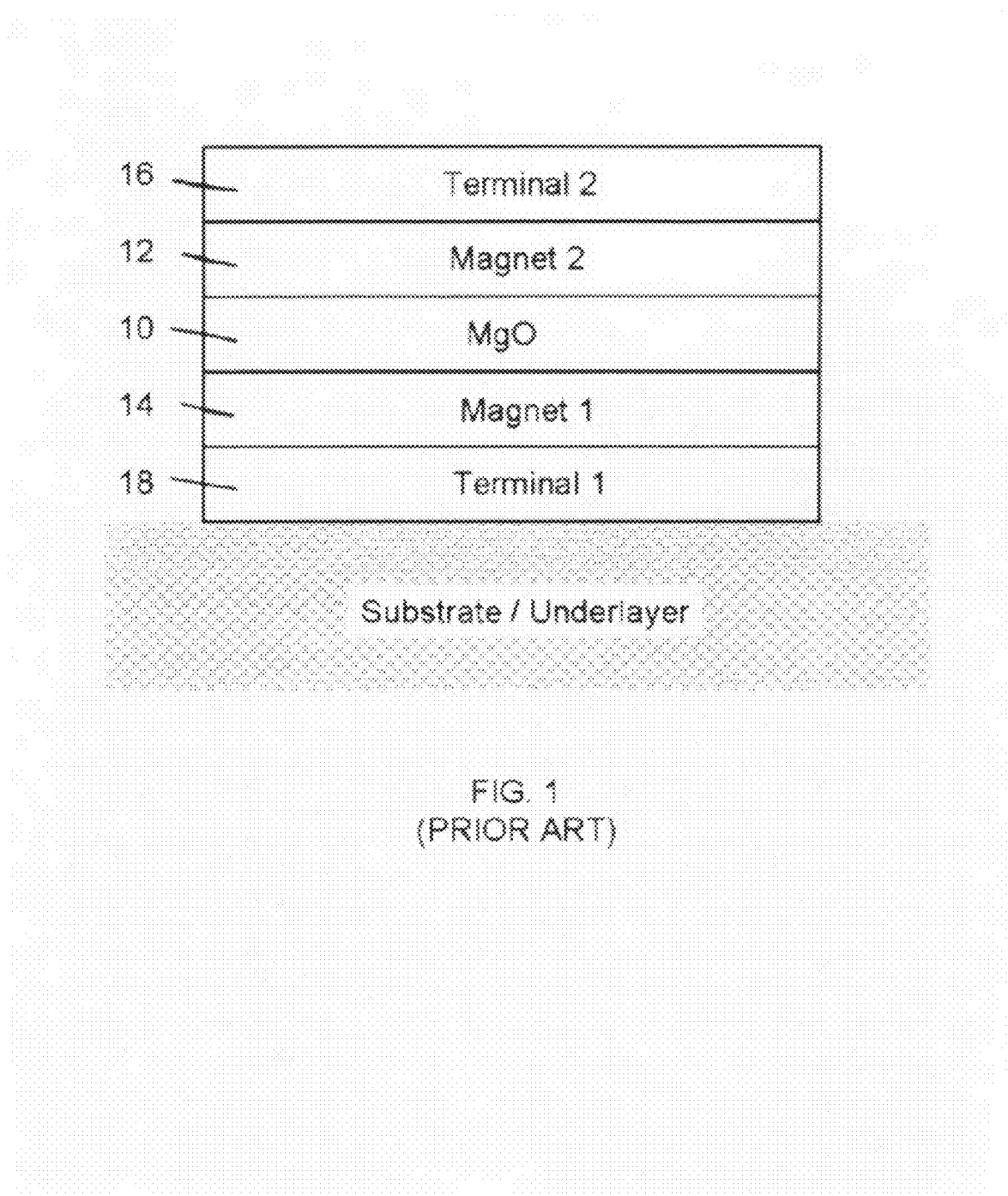
FIG. 1 illustrates a cross-section of a conventional magnetic junction having an MgO oxide layer separating two magnetic layers.

As described in the background multilayered magnetic devices utilizing tunneling effects, hereinafter refereed to as magnetic tunneling devices, are difficult to manufacture, or alternatively do not give the desired effects. Of special interest is the tunnel barrier 10, typically of MgO, in between the magnetic layers 12, 14 as illustrated in FIG. 1, and the center layer in magnetic double junctions. According to the present invention a tunnel barrier and/or a center layer is provided comprising a doped magnesium oxide (MgO). The dopand is preferably Al or Li. Also doping with B, Na, Si, P, S, K, Sc, Ti, Cu, or Rb is possible. The result of the doping, in the case of a MTJ, is that a material with reduced resistance compared to MgO is provided. Thereby the spacer layer can be made thicker without decreasing the performance of the device, or alternatively the performance may be increased maintaining the same thickness.

Tardio et al. [12] describe an experiment of doping chemically or by ion implantation MgO crystals with Li. They observe very large increases of 7 to 14 orders of magnitude in the electrical conductivity of the doped material compared to the nominally insulating pure MgO. Mg is a valence 2 metal, so doping with Li of valence 1 leads to formation of holes and a p-type semiconducting behavior. Other dopands in MgO discussed in the literature include Al, Cu, Co, Ni [13, 14, 15, 16]. As in the case of Li-doping, larger concentrations of other dopands are expected to substantially increase the conductivity of nominally insulating MgO. Thus doping provides a means for increasing the conductivity of MgO, which is desirable for the sensor, memory, and logic devices discussed.

In the case of devices utilizing a magnetic double junction, for example magnetic tunneling diodes and transistors, the doped MgO as a central layer results in a conductive center layer with significantly longer Fermi wavelength (lower carrier density) compared to the previously reported metal layer. The center layer according to the invention can be made thicker and is process compatible with the metal oxide stack.

Figure 2:
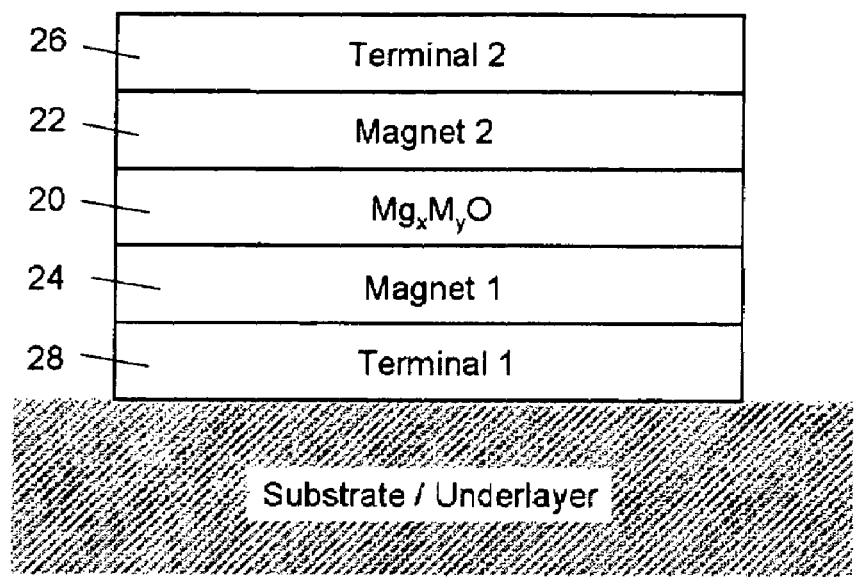
FIG. 2 illustrates a cross-section of a magnetic junction having a doped MgO layer separating two magnetic layers, according to the present invention.

One embodiment of the present invention is a magnetic tunnel junction, MTJ, as illustrated in FIG. 2, fabricated on a substrate or an underlayer generally as a part of an electronic circuit. Terminals 26 and 28 are connected to magnetic layers 22 and 24. The magnetic layers are preferably Fe, Co, Ni, alloys Fe—Co, Ni—Fe, Fe—Co—B, or other magnetic materials. Separating the magnetic layers is a layer of doped MgO, denoted $Mg_xM_yO$ 20, produced for example by post-deposition oxidation or reactive sputtering in $Ar$—$O_2$ atmosphere of Mg, which is alloyed with such elements as Li or Al (M). The concentration of Mg is preferably $x>0.9$. The concentration of the dopant is $y<<1$, preferably $y<0.1$. The magnetic junction is formed by sequential deposition of layers 24, 20, 22. The object of the doping of the $Mg_xM_yO$ layer 20 is to provide a layer that has a smaller resistance than a corresponding layer of undoped MgO for layer thickness >1 nm. The junction comprising a doped $Mg_xM_yO$ layer 20 should preferably have a resistance of <10% of that of a junction with an undoped MgO layer. The layer of doped $Mg_xM_yO$ can be made in the order of 1 to 10 nm and still maintaining the performance of the MTJ, compared to around 1 nm in a MTJ using undoped MgO. As apparent to the skilled in the art this is a great advantage from a production point of view.

Figure 3:
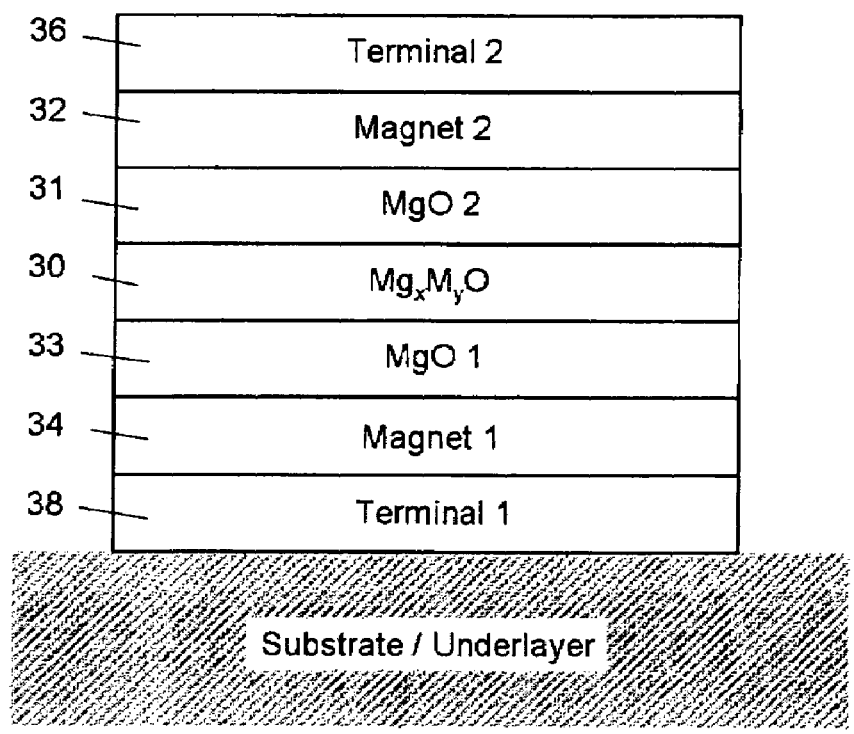
FIG. 3 illustrates a cross-section of a magnetic junction having a doped MgO layer and two MgO oxide layers separating two magnetic layers, according to the present invention.

A second embodiment of the present invention is a magnetic double junction as illustrated in FIG. 3, fabricated on a substrate or an underlayer generally as a part of an electronic circuit. Terminals 36 and 38 are connected to magnetic layers 32 and 34. The magnetic layers are preferably Fe, Co, Ni, alloys Fe—Co, Ni—Fe, Fe—Co—B, or other magnetic materials. The magnetic layers are insulated with MgO layers 31 and 33 from a layer of doped $Mg_xM_yO$ 30. Layers 30, 31, 33 are produced by post-deposition oxidation or reactive sputtering in $Ar$—$O_2$ atmosphere of doped and pure Mg in the case of layer 30 and layers 31 and 33, respectively. The concentration of Mg in layer 30 is preferably $x>0.9$. The concentration of the metal dopant is $y<<1$, preferably $y<0.1$. The magnetic double junction is formed by sequential deposition of layers 34, 33, 30, 31, 32. In addition to MR the device has diode functionality. The thicknesses of the two MgO barriers are individually varied from <1 nm to approximately 3 nm to optimize the MR (preferably >20%) and the diode effect (preferably RR>10). Compared to the center metal layer in previous magnetic double junction devices the center layer in the device according to this embodiment of the invention can be made significantly thicker, 1-100 nm, and the device still maintaining its functionality as regards to MR and RR.

Figure 4A:
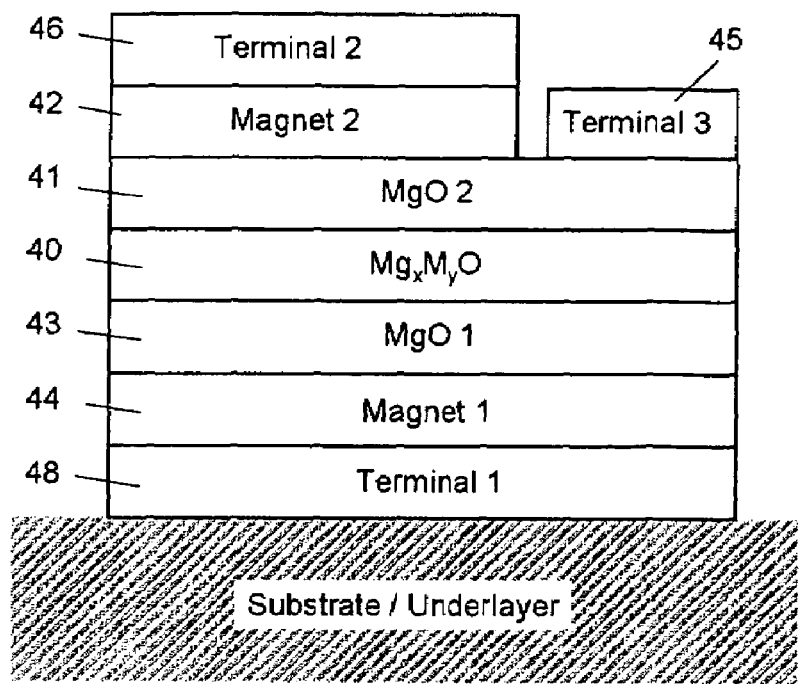
FIG. 4*a,b* illustrate a cross-section of a vertical magnetic junction having a doped MgO layer and two MgO oxide layers separating two magnetic layers and a third terminal in electrical (a) or physical (b) contact with the center $Mg_xM_yO$ electrode, according to the present invention.
Figure 4B:
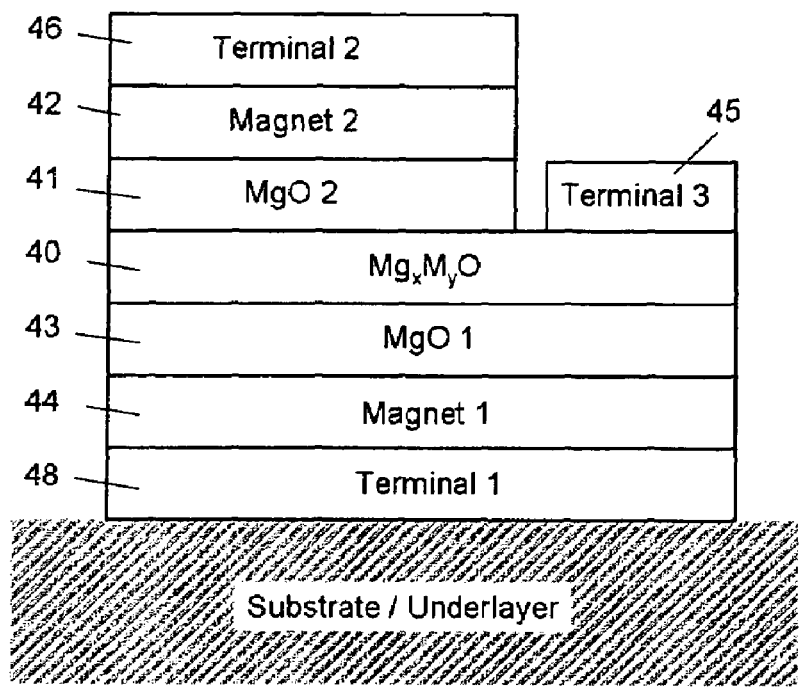

A third embodiment of the present invention is a three terminal device as illustrated in FIG. 4, fabricated on a substrate or an underlayer generally as a part of an electronic circuit. Terminals 46 and 48 are connected to magnetic layers 42 and 44. The magnetic layers are preferably Fe, Co, Ni, alloys Fe—Co, Ni—Fe, Fe—Co—B, or other magnetic materials. The magnetic layers are insulated with MgO layers 41 and 43 from a layer of doped $Mg_xM_yO$ 40. Layers 40, 41, 43 are produced by post-deposition oxidation or reactive sputtering in $Ar$—$O_2$ atmosphere of doped and pure Mg in the case of layer 40 and layers 41 and 43, respectively. The concentration of Mg in layer 40 is preferably $x \geq 0.9$. The concentration of the dopand is $y<<1$, preferably $y<0.1$. The magnetic double junction is formed by sequential deposition of layers 44, 43, 40, 41, 42. Layers 42 and 46 are patterned in such a way as to allow a third terminal (45) be placed in contact with MgO layer 41. Changing the potential on this terminal affects through electrostatic fields the energy levels in layer 40 and thereby the resistance between terminal 1 and terminal 2. Thus, in addition to MR the device has transistor functionality, with the third terminal (45) acting as a gate. Alternatively, a physical contact is made between the gate (45) and the center electrode (40) as indicated by the dashed area 47. This can be achieved by a suitable patterning of layers 42, 46, 41.

Figure 5:
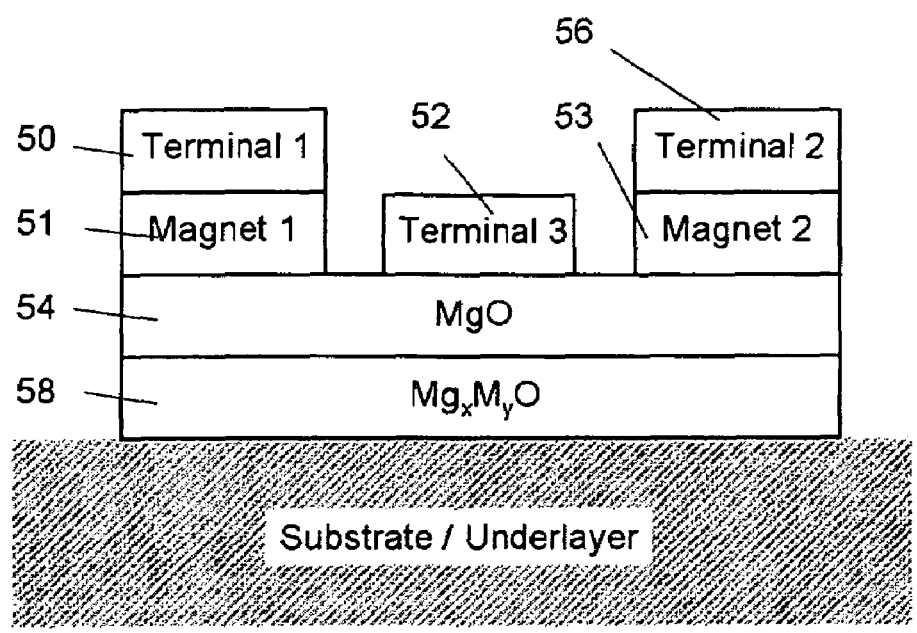
FIG. 5 illustrates a cross-section of a lateral magnetic junction having a doped MgO layer and a MgO oxide layer separating two magnetic layers and a third terminal in the vicinity of the center $Mg_xM_yO$ electrode, according to the present invention.

A variation on the above three terminal vertical device is a lateral device illustrated in FIG. 5, fabricated on a substrate or an underlayer generally as a part of an electronic circuit. Terminals 50 and 56 are connected to magnetic layers 51 and 53. The magnetic layers are preferably Fe, Co, Ni, alloys Fe—Co, Ni—Fe, Fe—Co—B, or other magnetic materials. The magnetic layers are insulated with MgO layer 54 from a layer of doped $Mg_xM_yO$ 58. Layers 58 and 54 are produced by post-deposition oxidation or reactive sputtering in $Ar$—$O_2$ atmosphere of doped and pure Mg, respectively. The concentration of Mg in layer 58 is preferably $x \geq 0.9$. The concentration of the metal dopand is $y<<1$, preferably $y<0.1$. Layers 50, 56, 51, and 53 are patterned in such a way as to allow a third terminal (52) be placed in contact with MgO layer 54. Changing the potential on this terminal affects through electrostatic fields the electronic states of layer 58. Thus, in addition to MR the device has transistor functionality, with the third terminal (52) acting as a gate.

It will be understood by those skilled in the art that the subdivision of the $MgO/Mg_xM_yO/MgO$ spacer into three layers in the description of the above embodiments can as well be referred to as an inhomogeneous doping of a single MgO layer. The said method of formation of the doped MgO layer by sputtering off an Mg target in $Ar$—$O_2$ mixture is one example. Other methods include, but are not limited to, sputtering of a composite $Mg_xM_yO$ oxide target in Ar, sputtering off an MgO target in $Ar$—$N_2$ mixture, or sputtering off an Mg target in $Ar$—$O_2$—$N_2$ mixture. In these cases M=Li, Al, N, . . . act as dopand atoms in MgO, with metal atoms preferentially substituting Mg and N atoms preferentially substituting O.

It will be further understood that various changes in form and detail can be made to the above illustrative embodiments without departing from the spirit and scope of the present invention.

REFERENCES

1. Fontan, Jr. et al., U.S. Pat. No. 5,729,410
2. Carey et al., U.S. Pat. No. 6,756,128
3. Slonczewski, U.S. Pat. No. 5,695,864
4. Slonczewski, J. Mag. Mag. Mat. 159, L1 (1996); ibid. 195, L261 (1999)
5. Fuchs et al, Appl. Phys. Lett. 85, 1205 (2004)
6. Gallagher et al., U.S. Pat. No. 5,640,343
7. Chiev et al. Europhys. Lett. 58, 257 (2002)
8. Botez et al., U.S. Pat. No. 6,229,153
9. Frensley et al., U.S. Pat. No. 4,959,696; Yang, U.S. Pat. No. 6,080,996
10. Moodera et al., Nature Materials 2, 707 (2003)
11. Parkin et al. Nature Materials 3, 862 (2004); Yuasa et al. ibid. 3, 868 (2004)

12. Tardio et al. Phys. Rev. B 66, 134202 (2002); Nucl. Instr. and Meth. in Phys. Res. B 218, 164 (2004)
13. Pedrosa et al. J. Appl. Phys. 62, 429 (1987)
14. Kärner et al. Radiation Meas. 33, 625 (2001)
15. Savoini et al. Nucl. Instr. and Meth. in Phys. Res. B 218, 148 (2004)
16. Pinto et al. Eur. Phys. J. B 45, 331 (2005)

The invention claimed is:

1. A magnetic junction device comprising two magnetic layers of different anisotropy, the two layers requiring a different amount of externally applied magnetic field or intrinsic spin-current-induced torque for switching their relative magnetic orientation, characterized by a center layer of doped MgO.

2. The magnetic junction device according to claim 1, wherein the dopant is a metal or a combination of metals.

3. The magnetic junction device according to claim 1, wherein the center layer is $Mg_xM_yO$, with $x>0.9$ and $y<<1$, where M is at least one of Li, Al or N.

4. The magnetic junction device according to claim 3, wherein the center layer is $Mg_xM_yO$, with $x>0.9$ and $y<<1$, where M is Li.

5. The magnetic junction device according to claim 4, wherein the center layer is $Mg_xM_yO$, $x>0.9$ and $y<<1$, where M is Al.

6. The magnetic junction device according to claim 1, wherein the center layer is $MgM_yO_{1-y}$, where M is N.

7. The magnetic junction device according to claim 1, wherein the center layer is $Mg_xM_yO$, with $x>0.9$ and $y<<1$, where M is one of, or a combination of, Li, Al, B, Na, Si, P, S, K, Sc, Ti, Cu, Rb.

8. The magnetic junction device according to claim 1, wherein one of the magnetic layers is a bilayer of a ferromagnetic layer exchange coupled to an antiferromagnetic layer to significantly increase anisotropy of said ferromagnetic layer, and essentially fix a direction of the ferromagnetic moment in the magnetic field range of interest.

9. The magnetic junction device according to claim 1, wherein one or both magnetic layers are flux closed tri-layers of two ferromagnetic layers and a non-magnetic spacer.

10. The magnetic junction device according to claim 1, wherein the doped MgO center layer separates the two magnetic layers, and has a resistance area product of less than 10 Ohm-$um^2$ and magneto-resistance of at least 20%.

11. A magnetic field sensor comprising two electrical terminals connected to the magnetic junction device according to claim 1, fabricated on a suitable substrate or underlayer.

12. A magnetic memory cell comprising two electrical terminals connected to the magnetic junction device according to claim 1, fabricated on a suitable substrate or underlayer.

13. The magnetic junction device according to claim 1, further comprising a first MgO tunnel junction in physical contact with one of the two said magnetic layers and a second MgO tunnel junction in physical contact with the other one of the two said magnetic layers, and wherein the doped MgO center layer separates the two MgO junctions, the doped layer having a resistivity much lower than that of undoped MgO but much higher than that of a typical metal.

14. The magnetic junction device according to claim 13, wherein the thicknesses of the two MgO layers are significantly different, ranging from <1 nm to approximately 3 nm.

15. A magnetic field sensor comprising two electrical terminals connected to the magnetic junction device according to claim 13, fabricated on a suitable substrate or underlayer.

16. A magnetic memory cell comprising two electrical terminals connected to the magnetic junction device according to claim 13, fabricated on a suitable substrate or underlayer.

17. The magnetic junction device according to claim 13, further comprising:
   a first MgO tunnel junction layer in physical contact with one of the two magnetic layers;
   a second MgO tunnel junction layer in physical contact with the other one of the two said magnetic layers; and
   a conducting gate electrode in physical or electrical contact with the doped $Mg_xM_yO$ center layer or with one of the MgO tunnel junction layers,
   whereby forming a magnetic three-terminal device and wherein the doped MgO center layer separates the two MgO junctions, the doped layer having the resistivity much lower than that of undoped MgO but much higher than that of a typical metal.

18. The magnetic double junction device according to claim 17, wherein the thicknesses of the two MgO layers are significantly different, ranging from <1 nm to approximately 3 nm.

19. A magnetic memory cell comprising three electrical terminals connected to the two magnetic layers and the gate electrode arranged according to claim 17, fabricated on a suitable substrate or underlayer.

20. A logic trans-resistor device comprising three electrical terminals connected to the two magnetic layers and the gate electrode arranged according to claim 17 fabricated on a suitable substrate or underlayer.

21. A method of producing a magnetic junction device comprising two magnetic layers of different anisotropy, the two layers requiring a different amount of externally applied magnetic field or intrinsic spin-current induced torque for switching their relative magnetic orientation, characterized by a sequential deposition of the first magnetic layer, a center layer of doped MgO, and a second magnetic layer.

22. The method according to claim 21, wherein the doped MgO layer is formed by post-deposition oxidation or reactive sputtering.

* * * * *